(12) United States Patent
Lin et al.

(10) Patent No.: US 9,147,587 B2
(45) Date of Patent: Sep. 29, 2015

(54) INTERCONNECT SUBSTRATE WITH EMBEDDED SEMICONDUCTOR DEVICE AND BUILT-IN STOPPER AND METHOD OF MAKING THE SAME

(71) Applicant: Bridge Semiconductor Corporation, Taipei (TW)

(72) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 113 days.

(21) Appl. No.: 13/738,314

(22) Filed: Jan. 10, 2013

(65) Prior Publication Data

US 2014/0048944 A1 Feb. 20, 2014

Related U.S. Application Data

(60) Provisional application No. 61/682,801, filed on Aug. 14, 2012.

(51) Int. Cl.
| | |
|---|---|
| H01L 21/58 | (2006.01) |
| H01L 23/485 | (2006.01) |
| H01L 23/00 | (2006.01) |
| H01L 23/498 | (2006.01) |

(52) U.S. Cl.
CPC .............. *H01L 21/58* (2013.01); *H01L 23/485* (2013.01); *H01L 23/49822* (2013.01); *H01L 23/49827* (2013.01); *H01L 23/562* (2013.01); *H01L 24/13* (2013.01); *H01L 24/16* (2013.01); *H01L 2224/0401* (2013.01); *H01L 2224/04105* (2013.01); *H01L 2224/131* (2013.01); *H01L 2224/16145* (2013.01); *H01L 2224/16227* (2013.01); *H01L 2924/15172* (2013.01); *H01L 2924/171* (2013.01); *Y10T 428/24917* (2015.01)

(58) Field of Classification Search
CPC ....... H01L 24/19; H01L 21/58; H01L 23/485; H01L 23/562; H01L 23/49822; H01L 23/49827
USPC ........................................... 438/118; 257/773
See application file for complete search history.

(56) References Cited

U.S. PATENT DOCUMENTS

| | | | |
|---|---|---|---|
| 6,861,720 B1 | 3/2005 | Heckman et al. | |
| 7,405,103 B2 | 7/2008 | Chang | |
| 7,935,893 B2 | 5/2011 | Tanaka et al. | |
| 7,944,039 B2 | 5/2011 | Arai | |
| 7,999,401 B2 | 8/2011 | Murai et al. | |

(Continued)

*Primary Examiner* — Walter H Swanson
(74) *Attorney, Agent, or Firm* — Bacon & Thomas, PLLC

(57) ABSTRACT

The present invention relates to an interconnect substrate with an embedded device, a built-in stopper and dual build-up circuitries and a method of making the same. In accordance with one preferred embodiment of the present invention, the method includes: forming a stopper on a dielectric layer; mounting a semiconductor device on the dielectric layer using the stopper as a placement guide for the semiconductor device; attaching a stiffener to the dielectric layer; forming a first build-up circuitry and a second build-up circuitry that cover the semiconductor device, the stopper and the stiffener at both sides; and providing a plated through-hole that provides an electrical connection between the first and second build-up circuitries. Accordingly, the stopper can accurately confine the placement location of the semiconductor device and avoid the electrical connection failure between the semiconductor device and the build-up circuitry.

38 Claims, 10 Drawing Sheets

(56) References Cited

U.S. PATENT DOCUMENTS

| | | |
|---|---|---|
| 8,026,590 B2 | 9/2011 | Kang et al. |
| 2007/0290366 A1* | 12/2007 | Cheng .......................... 257/778 |
| 2009/0215231 A1* | 8/2009 | Inoue ........................... 438/125 |
| 2010/0062564 A1* | 3/2010 | Sakaguchi et al. ............ 438/106 |
| 2010/0184256 A1 | 7/2010 | Chino |
| 2011/0289773 A1 | 12/2011 | Tanaka et al. |
| 2012/0000068 A1 | 1/2012 | Sakamoto et al. |
| 2012/0119391 A1 | 5/2012 | Koizumi et al. |
| 2012/0120609 A1 | 5/2012 | Chou et al. |

* cited by examiner

INTERCONNECT SUBSTRATE WITH EMBEDDED SEMICONDUCTOR DEVICE AND BUILT-IN STOPPER AND METHOD OF MAKING THE SAME

CROSS REFERENCE TO RELATED APPLICATION

This application claims the benefit of filing date of U.S. Provisional Application Ser. No. 61/682,801, entitled "Structure and Manufacture of Semiconductor Assembly and 3D Stacking thereof" filed Aug. 14, 2012 under 35 USC §119(e)(1).

BACKGROUND OF THE INVENTION

1. Field of the Invention

The present invention relates to an interconnect substrate for a semiconductor assembly and a method of making the same, and more particularly to an interconnect substrate with embedded semiconductor device and built-in stopper and a method of making the same.

2. Description of Related Art

As market trend demands for thinner, smarter and cheaper portable electronics, semiconductor devices for use in these equipments are required to further shrink their size and improve electrical performances at lower cost. Among all the efforts, embedding or built-in semiconductor chip in printed wiring board to form a module assembly is considered the most effective approach since it can drastically reduce the overall weight, thickness and improve electrical performance through a shorten interconnect distance.

However, the attempt of embedding chip in a wiring board can encounter many problems. For example, the chip to be embedded is known to vertically and laterally shift during die attach and encapsulation/lamination processes due to thermal characteristics of plastic materials. The CTE mismatch between metal, dielectric and silicon at various stages of thermal treatment can result in misalignment of the build-up interconnect structure to be deposited thereon. U.S. Pat. No. 7,935,893 to Tanaka et. al., U.S. Pat. No. 7,944,039 to Aral and U.S. Pat. No. 7,405,103 to Chang disclose various alignment methods to address manufacturing yield concern. None of these approaches offers a proper solution or effective method for controlling die movement because the underneath adhesive will reflow during curing and therefore dislocates the attached die from the pre-determined location even a highly precise alignment mark and equipment are applied. U.S. Patent Application 2010/0184256 to Chino discloses a resin sealing method to fix the semiconductor device adhered to the adhesive layer formed on the support body. This approach may be effective in controlling die from further movement during sealing process, it does not provide any control or adjustment for die attach process and the misregistration is unavoidable due to die attach adhesive reflows.

SUMMARY OF THE INVENTION

The present invention has been developed in view of such a situation, and an object thereof is to provide an interconnect substrate with dual build-up circuitries in which a semiconductor device is precisely affixed at a predetermined location by a stopper, warp and bend of the semiconductor device can be suppressed, and electrical connection between the semiconductor device and the build-up circuitry can be securely retained by conductive via.

In a preferred embodiment, the present invention provides a method of making an interconnect substrate that includes a semiconductor device, a stopper, a stiffener and dual build-up circuitries. The method of making the interconnect substrate can include: forming a stopper on a dielectric layer; mounting a semiconductor device on the dielectric layer using the stopper as a placement guide for the semiconductor device that includes an active surface with a contact pad thereon and an inactive surface, wherein the active surface faces a first vertical direction, the inactive surface faces a second vertical direction opposite the first vertical direction, and the stopper is located in close proximity to and laterally aligned with and laterally extends beyond peripheral edges of the semiconductor device in lateral directions orthogonal to the vertical directions; attaching a stiffener to the dielectric layer, including aligning the semiconductor device and the stopper within an aperture of the stiffener; forming a first build-up circuitry that covers the stopper, the semiconductor device and the stiffener in the first vertical direction and includes a first conductive via that directly contacts the contact pad of the semiconductor device to provide an electrical connection between the semiconductor device and the first build-up circuitry; forming a second build-up circuitry that covers the stopper, the semiconductor device and the stiffener in the second vertical direction; and providing a plated through-hole that extends through the stiffener in the vertical directions to provide an electrical connection between the first build-up circuitry and the second build-up circuitry.

Forming the stopper on the dielectric layer can include: providing a laminate substrate that includes a metal layer and the dielectric layer; and then removing a selected portion of the metal layer to form the stopper. Alternatively, forming the stopper on the dielectric layer can include: providing a laminate substrate that includes a metal layer and the dielectric layer; then removing a selected portion of the metal layer to form a recessed portion; then depositing a plastic material into the recessed portion as the stopper; and then removing a remaining portion of the metal layer. Accordingly, the stopper can be made of a metal, a photosensitive plastic material or non-photosensitive material. For instance, the stopper can consist essentially of copper, aluminum, nickel, iron, tin or their alloys. The stopper can also consist of epoxy or polyimide.

The method of making an interconnect substrate according to the present invention can further include: forming a placement guide on the dielectric layer. Accordingly, attaching the stiffener to the dielectric layer can include: aligning the semiconductor device and the stopper within the aperture of the stiffener with the placement guide being in close proximity to and laterally aligned with and laterally extending beyond the outer peripheral edges of the stiffener in lateral directions.

Forming the stopper and the placement guide on the dielectric layer can include: providing a laminate substrate that includes a metal layer and the dielectric layer; and then removing a selected portion of the metal layer to form the stopper and the placement guide. Alternatively, forming the stopper and the placement guide on the dielectric layer can include: providing a laminate substrate that includes a metal layer and the dielectric layer; then removing a selected portion of the metal layer to form a recessed portion; then depositing a plastic material into the recessed portion as the stopper and the placement guide; and then removing a remaining portion of the metal layer. Accordingly, like the stopper, the placement guide for the stiffener can be made of a metal, a photosesitive plastic material or non-photosensitive material, such as copper, aluminum, nickel, iron, tin, alloys, epoxy or polyimide.

The laminate substrate can optionally further include a support plate, and the dielectric layer can be sandwiched between the metal layer and the support plate. Optionally, the method of making an interconnect substrate according to the present invention can further include: removing the support plate or thinning the support plate after mounting the semiconductor device and attaching the stiffener.

The semiconductor device can be attached to the dielectric layer using an adhesive that contacts and is sandwiched between the semiconductor device and the dielectric layer. Likewise, the stiffener can be attached to the dielectric layer using an adhesive that contacts and is sandwiched between the stiffener and the dielectric layer. Additionally, the semiconductor device can be mounted on the dielectric layer with the active surface or inactive surface facing the dielectric layer. In the case that the active surface of the semiconductor device faces the dielectric layer, the stopper and the placement guide extend from the dielectric layer in the second vertical direction, and the adhesive can contact and be coplanar with the stopper and the placement guide in the first vertical direction and lower than the stopper and the placement guide in the second vertical direction. As a result, the semiconductor device and the stiffener can be affixed and mechanically connected to the first build-up circuitry at predetermined location defined by the stopper and the placement guide that extend from the first insulating layer of the first build-up circuitry and respectively extend beyond the active surface of the semiconductor device and the attached surface of the stiffener in the second vertical direction. As the adhesive is lower than the stopper and the placement guide in the second vertical direction, the stopper and the placement guide can stop the undesirable movement of the semiconductor device and the stiffener during curing the adhesive that contacts and is sandwiched between the active surface of the semiconductor device and the first build-up circuitry and between the stiffener and the first build-up circuitry. Likewise, in the case that the inactive surface of the semiconductor device faces the dielectric layer, the stopper and the placement guide extend from the dielectric layer in the first vertical direction, and the adhesive can contact and be coplanar with the stopper and the placement guide in the second vertical direction and lower than the stopper and the placement guide in the first vertical direction. Accordingly, the semiconductor device and the stiffener can be affixed and mechanically connected to the second build-up circuitry at predetermined location defined by the stopper and the placement guide that extend from the second insulating layer of the second build-up circuitry and respectively extend beyond the inactive surface of the semiconductor device and the attached surface of the stiffener in the first vertical direction.

The first build-up circuitry can include a first insulating layer and one or more first conductive traces, while the second build-up circuitry can include a second insulating layer and one or more second conductive traces. For instance, the first insulating layer covers the semiconductor device, the stopper and the stiffener in the first vertical direction and the first conductive traces extend from the first insulating layer in the first vertical direction, while the second insulating layer covers the semiconductor device, the stopper and the stiffener in the second vertical direction and the second conductive traces extend from the second insulating layer in the second vertical direction. As a result, forming the first build-up circuitry and the second build-up circuitry can include: providing a first insulating layer that covers the stopper, the semiconductor device and the stiffener in the first vertical direction; providing a second insulating layer that covers the stopper, the semiconductor device and the stiffener in the second vertical direction; forming one or more first via openings that extend through the first insulating layer and are aligned with one or more contact pads of the semiconductor device and optionally one or more additional first via openings that extend through the first insulating layer and are aligned with the stiffener; optionally forming one or more second via openings that extend through the second insulating layer and are aligned with the inactive surface of the semiconductor device or/and the stiffener; forming one or more first conductive traces that extend from the first insulating layer in the first vertical direction and extend laterally on the first insulating layer and extend through the first via openings and optionally the additional first via openings in the second vertical direction to form one or more first conductive vias in direct contact with the contact pads of the semiconductor device and optionally one or more additional first conductive vias in direct contact with the stiffener; and forming one or more second conductive trace that extend from the second insulating layer in the second vertical direction and extend laterally on the second insulating layer and optionally extend through the second via openings in the first vertical direction to form one or more second conductive vias in direct contact with the inactive surface of the semiconductor device or/and the stiffener. Accordingly, the first conductive traces can directly contact the contact pads to provide signal routing for the semiconductor device, and thus the electrical connection between the semiconductor device and the build-up circuitry can be devoid of solder. Besides, the second conductive traces can directly contact the inactive surface of the semiconductor device to provide thermal dissipation pathway for the semiconductor device. The first and second conductive traces can also directly contact the stiffener for grounding or electrical connections to passive components such as thin film resistors or capacitors deposited thereon. In the case that the active surface of the semiconductor device faces the dielectric layer, the first insulating layer of the first build-up circuitry includes the dielectric layer, and the first via opening extends through the dielectric layer and the adhesive. For instance, the dielectric layer can serve as the first insulating layer and is provided with the first via openings that extend through the dielectric layer and the adhesive, followed by forming the first conductive traces that extend from the dielectric layer in the first vertical direction and may include the remaining portion of the support plate. Alternatively, a metal layer may be attached to the dielectric layer using an interlayer dielectric, and the combination of the dielectric layer and the interlayer dielectric serves as the first insulating layer and is provided with the first via openings that extend through the dielectric layer, the interlayer dielectric and the adhesive, followed by forming the first conductive traces that include the metal layer and extend from the interlayer dielectric in the first vertical direction. In another case that the inactive surface of the semiconductor device faces the dielectric layer, the second insulating layer of the second build-up circuitry includes the dielectric layer, and the second via opening extends through the dielectric layer and the adhesive. For instance, the second insulating layer of the second build-up circuitry may be the dielectric layer or the combination of the dielectric layer and an interlayer dielectric that bonds a metal layer to the dielectric layer.

The first and second build-up circuitries can further include additional insulating layers, additional via openings, and additional conductive traces if needed for further signal routing. For instance, the first build-up circuitry can further include a third insulating layer, one or more third via openings and one or more third conductive traces. The third insulating layer can extend from the first insulating layer and the first conductive trace in the first vertical direction and can extend to peripheral edges of the interconnect substrate, and the third conductive traces extend from the third insulating layer in the first vertical direction. As a result, forming the first build-up circuitry can further include: providing a third insulating layer on the first insulating layer and the first conductive trace that extends from the first insulating layer and the first conductive trace in the first vertical direction; then forming one or more third via openings that extend through the third insulating layer and are aligned with the first conductive trace; and then forming one or more third conductive traces that extend from the third insulating layer in the first vertical direction and extend laterally on the third insulating layer and extend through the third via openings in the second vertical direction to form one or more third conductive vias in direct contact with the first conductive traces, thereby electrically connecting the first conductive trace to the third conductive traces. Likewise, the second build-up circuitry can further include a fourth insulating layer, one or more fourth via openings and one or more fourth conductive traces. The fourth insulating layer can extend from the second insulating layer and the second conductive trace in the second vertical direction and can extend to peripheral edges of the interconnect substrate, and the fourth conductive traces extend from the fourth insulating layer in the second vertical direction. As a result, providing the second build-up circuitry can further include: providing a fourth insulating layer on the second insulating layer and the second conductive trace that extends from the second insulating layer and the second conductive trace in the second vertical direction; then forming one or more fourth via openings that extend through the fourth insulating layer and are aligned with the second conductive trace; and then forming one or more fourth conductive traces that extend from the fourth insulating layer in the second vertical direction and extend laterally on the fourth insulating layer and extend through the fourth via openings in the first vertical direction to form one or more fourth conductive vias in direct contact with the second conductive traces, thereby electrically connecting the second conductive trace to the fourth conductive traces.

The first and second via openings can be simultaneously formed, and the first and second conductive traces can be simultaneously deposited and patterned. Likewise, the third and fourth via openings can be simultaneously formed, and the third and fourth conductive traces can be simultaneously deposited and patterned. The first, second, third and fourth via openings can have the same size. The first and third insulating layers and conductive traces can have flat elongated surfaces that face in the first vertical direction, while the second and fourth insulating layers and conductive traces can have flat elongated surfaces that face in the second vertical direction.

The outmost conductive traces of the first and second build-up circuitries can respectively include one or more first and second interconnect pads to provide electrical contacts for the next level assembly or another electronic device such as a semiconductor chip, a plastic package or another semiconductor assembly. The first interconnect pads can include an exposed contact surface that faces in the first vertical direction, while the second interconnect pads can include an exposed contact surface that faces in the second vertical direction. As a result, the interconnect substrate can include electrical contacts (i.e. the first and second interconnect pads) that are electrically connected to one another and located on opposite surfaces that face in opposite vertical directions, so that the interconnect substrate with embedded semiconductor device is stackable and the next level assembly or another electronic device can be electrically connected to the embedded semiconductor device using a wide variety of connection media including wire bonding or solder bumps as the electrical contacts. Besides, the second build-up circuitry may further include a paddle layer that extends from the outmost insulating layer of the second build-up circuitry and has an exposed contact surface that faces in the second vertical direction. Accordingly, another electronic device can be mounted on the paddle layer and be electrically connected to the outmost conductive trace of the second build-up circuitry by wire bonding or solder bumps.

Providing the plated through-hole can include forming a through-hole that extends through the stiffener and the dielectric layer in the vertical directions, and then depositing a connecting layer on an inner sidewall of the through-hole.

The plated through-hole can be provided during providing the first build-up circuitry and the second build-up circuitry. For instance, providing the plated through-hole can include forming a through-hole that extends through the stiffener and the insulating layers (e.g. extends through the first and second insulating layers, or extends through the first, second, third and fourth insulating layers) in the vertical directions after providing the insulating layers and then depositing a connecting layer on an inner sidewall of the through-hole during depositing the conductive traces (e.g. the first conductive trace/the second conductive trace or the third conductive trace/the fourth conductive trace).

The insulating layers can be deposited and extend to peripheral edges of the interconnect substrate by numerous techniques including film lamination, roll coating, spin coating and spray-on deposition. The via openings can be formed through the insulating layers by numerous techniques including laser drilling, plasma etching and photolithography. The conductive traces can be formed by depositing a plated layer that covers the insulating layer and extends through the via opening and then removing selected portions of the plated layer using an etch mask that defines the conductive trace. The plated layers and the connecting layer can be deposited by numerous techniques including electroplating, electroless plating, evaporating, sputtering, and their combinations as a single layer or multiple layers. The plated layers can be patterned by numerous techniques including wet etching, electro-chemical etching, laser-assist etching, and their combinations to define the conductive traces.

By the above-mentioned method, the present invention can provide an interconnect substrate that includes: a semiconductor device that includes an active surface with one or more contact pads thereon and an inactive surface, wherein the active surface faces a first vertical direction and the inactive surface faces a second vertical direction opposite the first vertical direction; a stopper that serves as a placement guide for the semiconductor device and is in close proximity to and laterally aligned with and laterally extends beyond peripheral edges of the semiconductor device in lateral directions orthogonal to the vertical directions; a stiffener that includes an aperture with the semiconductor device and the stopper extending thereinto; a first build-up circuitry that covers the stopper, the semiconductor device and the stiffener in the first vertical direction and includes a first insulating layer, one or more first via openings and one or more first conductive traces, wherein the first via openings in the first insulating layer are aligned with the contact pads of the semiconductor device and optionally the stiffener, and the first conductive traces extend from the first insulating layer in the first vertical direction and extend through the first via openings in the second vertical direction and directly contact the contact pads and optionally the stiffener; a second build-up circuitry that covers the stopper, the semiconductor device and the stiffener in the second vertical direction and includes a second insulating layer, optionally one or more second via openings and one or more second conductive traces, wherein the second via openings in the second insulating layer are aligned with the stiffener and/or the inactive surface of the semiconductor device, and the second conductive trace extend from the second insulating layer in the second vertical direction and optionally extend into the second via openings in the first vertical direction and directly contact the stiffener and/or the inactive surface; and a plated through-hole that extends through the stiffener to provide an electrical connection between the first build-up circuitry and the second build-up circuitry. Optionally, the interconnect substrate can further include: a placement guide that is in close proximity to and laterally aligned with and laterally extends beyond the outer peripheral edges of the stiffener in lateral directions orthogonal to the vertical directions.

The stopper and the placement guide can have patterns against undesirable movement of the semiconductor device and the stiffener, respectively. For instance, the stopper and the placement guide can include a continuous or discontinuous strip or an array of posts. The stopper and the placement guide can be simultaneously formed and have the same or different patterns. Specifically, the stopper can be laterally aligned with four lateral surfaces of the semiconductor device to stop the lateral displacement of the semiconductor device. For instance, the stopper can be aligned along and conform to four sides, two diagonal corners or four corners of the semiconductor device and a gap in between the semiconductor device and the stopper preferably is in a range of about 0.001 to 1 mm. The semiconductor device can be spaced from the inner wall of the aperture by the stopper, and a bonding material can be added between the semiconductor device and the stiffener to enhance rigidity or the first insulating layer of the build-up circuitry may extend into and fill the gap between the semiconductor device and the stiffener. Moreover, the stopper can also be in close proximity to and laterally aligned with the inner wall of the aperture to stop the lateral displacement of the stiffener. Likewise, the placement guide can be laterally aligned with four outer lateral surfaces of the stiffener to stop the lateral displacement of the stiffener. For instance, the placement guide can be aligned along and conform to four outer sides, two outer diagonal corners or four outer corners of the stiffener and a gap in between the outer peripheral edges of the stiffener and the placement guide preferably is in a range of about 0.001 to 1 mm. Besides, the stopper and the placement guide preferably have a thickness in a range of 10-200 microns.

The stiffener can extend to peripheral edges of the interconnect substrate and provide mechanical support to suppress warp and bend of the semiconductor device. Moreover, the stiffener also can provide ground/power plane and heat sink for the build-up circuitry. The stiffener can be a single layer structure or a multi-layer structure (such as a circuit board or a multi-layer ceramic board or a laminate of a substrate and a conductive layer). For instance, the stiffener can be made of ceramics or other various inorganic materials, such as aluminum oxide ($Al_2O_3$), aluminum nitride (AlN), silicon nitride (SiN), silicon (Si), glass, etc. The stiffener can also be made of organic materials such as laminated epoxy, polyimide or copper-clad laminate.

The semiconductor device can be a packaged or unpackaged semiconductor chip. For instance, the semiconductor device can be a land grid array (LGA) package or wafer level package (WLP) that includes a semiconductor chip. Alternatively, the semiconductor device can be a semiconductor chip.

The interconnect substrate with embedded semiconductor device can be further used for first-level or second-level semiconductor assembly. For instance, a single chip or multiple chips can be assembled to the substrate and form a three dimensional stacked package. Alternatively, the interconnect substrate with embedded device can be further used for a second-level assembly wherein a single package such as BGA or multiple packages can be soldered onto the substrate and form a three dimensional stacked module.

Unless specific descriptions or using the term "then" between steps or steps necessarily occurring in a certain order, the sequence of the above-mentioned steps is not limited to that set forth above and may be changed or reordered according to desired design.

The present invention has numerous advantages. The stiffener can provide a power/ground plane, a heat sink and a robust mechanical support for the semiconductor device and the build-up circuitry. The stopper can accurately confine the placement location of the semiconductor device and avoid the electrical connection failure between the semiconductor device and the build-up circuitry resulted from the lateral displacement of the semiconductor device, thereby improving the manufacturing yield greatly.

The direct electrical connection without solder between the semiconductor device and the build-up circuitry is advantageous to high I/O and high performance. The plated through-hole can provide vertical signal routing between the two build-up circuitries with respective interconnect pads at both sides of the interconnect substrate, thereby providing the next level semiconductor assembly with device-on-device stacking feature. The interconnect substrate made by this method is reliable, inexpensive and well-suited for high volume manufacture.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1', 1" and 2' are cross-sectional views showing an alternative method of forming a stopper on a dielectric layer in accordance with an embodiment of the present invention;

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

[Embodiment 1]

Figure 1:
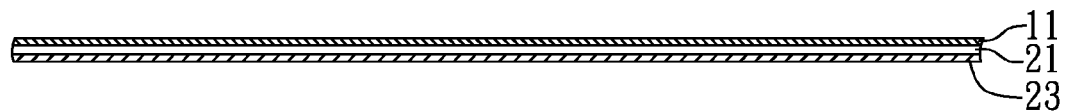
FIGS. 1 and 2 are cross-sectional views showing a method of forming a stopper on a dielectric layer in accordance with an embodiment of the present invention.
Figure 2:
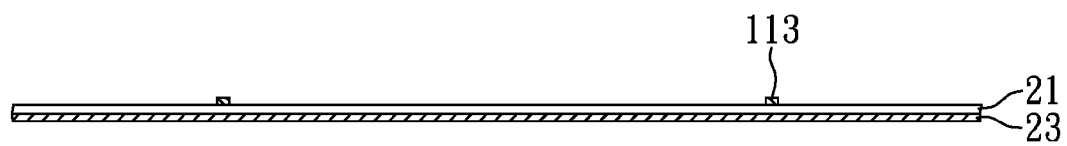
Figure 2A:
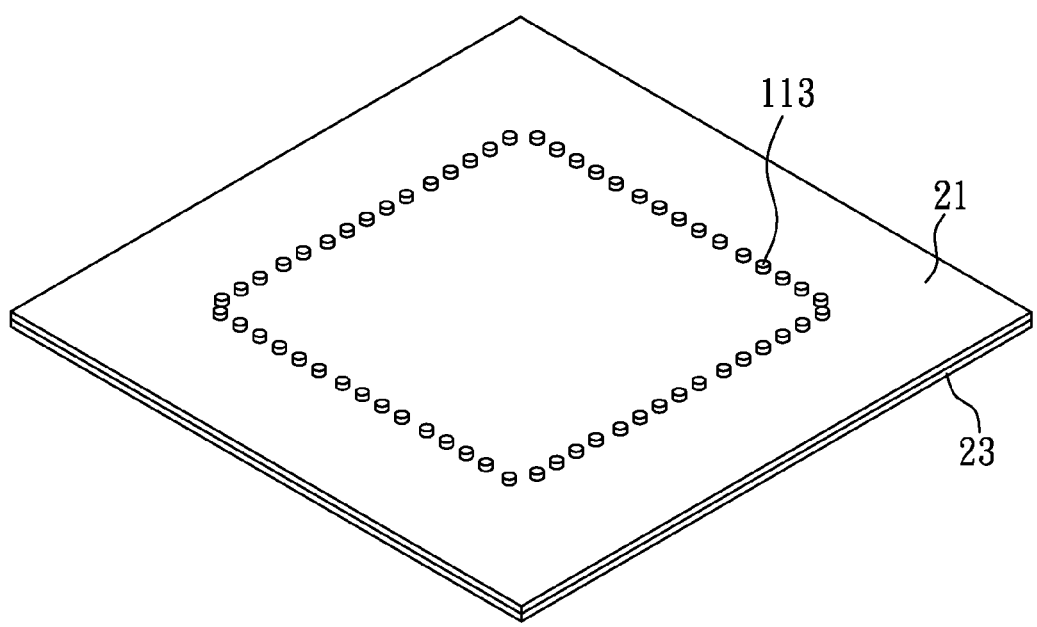
FIG. 2A is a top view corresponding to FIG. 2.
Figure 1:
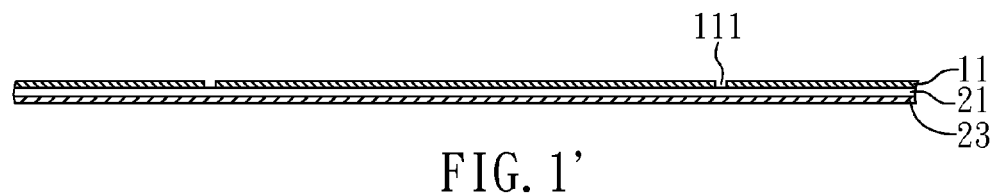
Figure 1:
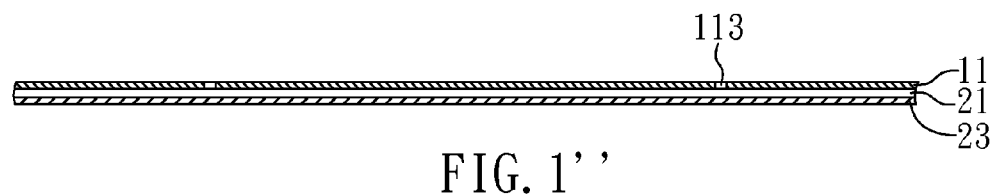
Figure 2:
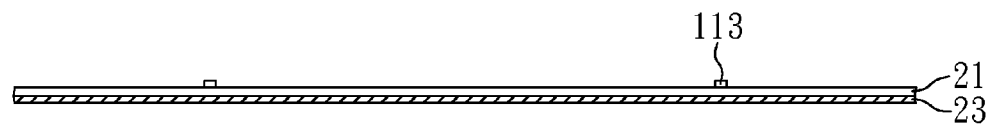
Figure 2A:
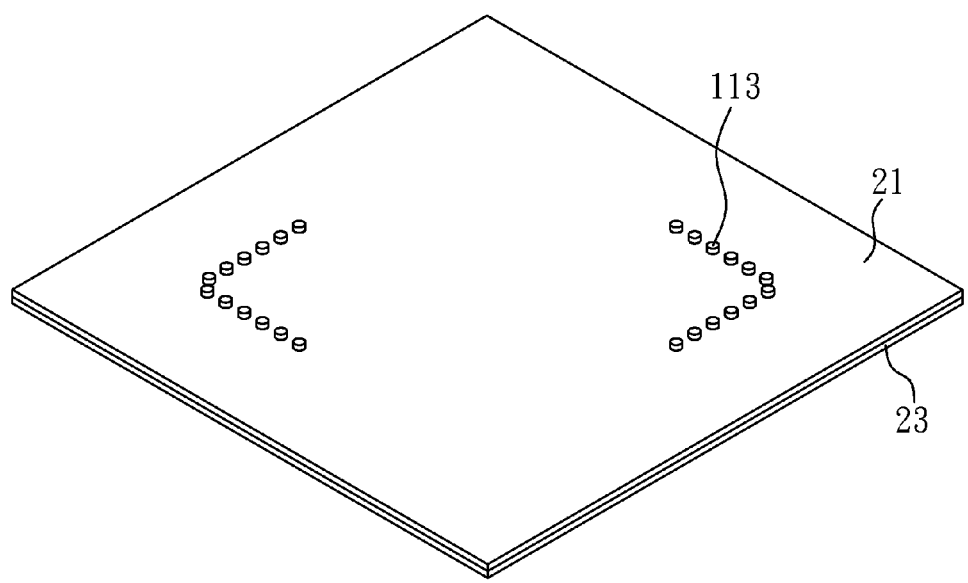
Figure 2B:
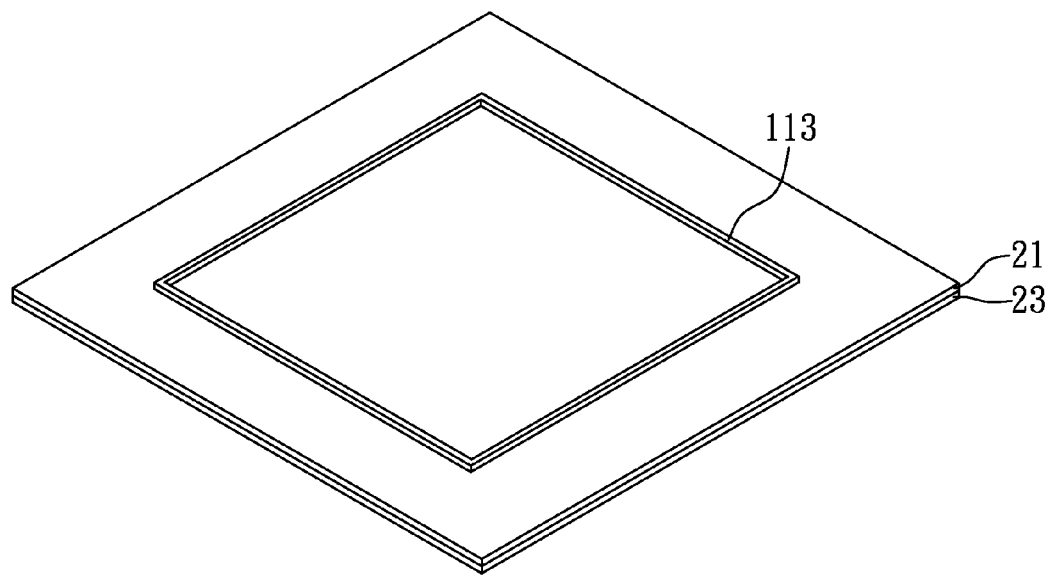
FIGS. 2B-2E are top views of various stopper patterns that can be practiced in the present invention.
Figure 2C:
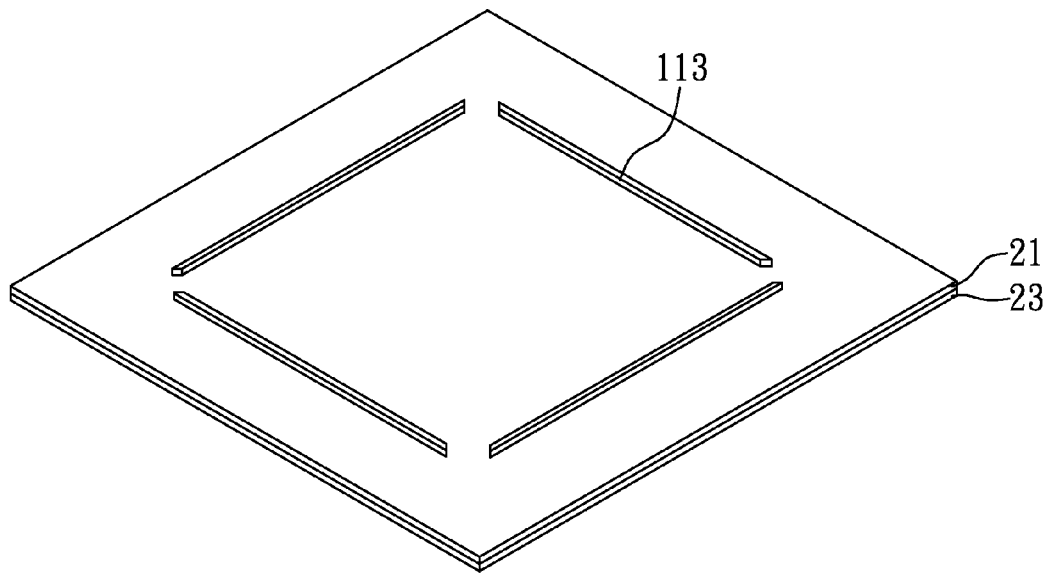

FIGS. 1 and 2 are cross-sectional views showing a method of forming a stopper on a dielectric layer in accordance with an embodiment of the present invention, and FIG. 2A is a top view corresponding to FIG. 2.

FIG. 1 is a cross-sectional view of a laminate substrate that includes metal layer 11, dielectric layer 21 and support plate 23. Metal layer 11 is illustrated as a copper layer with a thickness of 35 microns. However, metal layer 11 can also be made of other various metal materials and is not limited to a copper layer. Besides, metal layer 11 can be deposited on dielectric layer 21 by numerous techniques including lamination, electroplating, electroless plating, evaporating, sputtering, and their combinations as a single layer or multiple layers, and preferably has a thickness in a range of 10 to 200 microns.

Dielectric layer 21 typically is made of epoxy resin, glass-epoxy, polyimide and the like and has a thickness of 50 microns. In this embodiment, dielectric layer 21 is sandwiched between metal layer 11 and support plate 23. However, support plate 23 may be omitted in some embodiments. Support plate 23 typically is made of copper, but copper alloys or other materials are also doable. The thickness of support plate 23 can range from 25 to 1000 microns, and preferably ranges from 35 to 100 microns in consideration of process and cost. In this embodiment, support plate 23 is illustrated as a copper plate with a thickness of 35 microns.

FIGS. 2 and 2A are cross-sectional and top views, respectively, of the structure with stopper 113 formed on dielectric layer 21. Stopper 113 can be formed by removing selected portions of metal layer 11 using photolithography and wet etching. In this illustration, stopper 113 consists of plural metal posts in a rectangular frame array and conforms to four sides of a semiconductor device subsequently disposed on dielectric layer 21. However, stopper patterns are not limited thereto and can be other various patterns against undesirable movement of the subsequently disposed semiconductor device.

FIGS. 1' and 2' are cross-sectional views showing an alternative method of forming a stopper on a dielectric layer, and FIG. 2A' is a top view corresponding to FIG. 2'.

FIG. 1' is a cross-sectional view of a laminate substrate with a set of cavities 111. The laminate substrate includes metal layer 11, dielectric layer 21 and support plate 23 as above mentioned, and cavities 111 are formed by removing selected portions of metal layer 11.

FIG. 1" is a cross-sectional view showing the structure with a plastic material deposited into the cavities 111 as a stopper 113.

FIGS. 2' and 2A' are cross-sectional and top views, respectively, of the structure with stopper 113 formed on dielectric layer 21. Stopper 113 can be formed by dispensing or printing a photosensitive plastic material (e.g., epoxy, polyimide, etc.) or non-photosensitive material into cavities 111, followed by removing overall metal layer 11. Herein, stopper 113 is illustrated as an array of plural resin posts and conforms to two diagonal corners of a subsequently disposed semiconductor device.

Figure 2D:
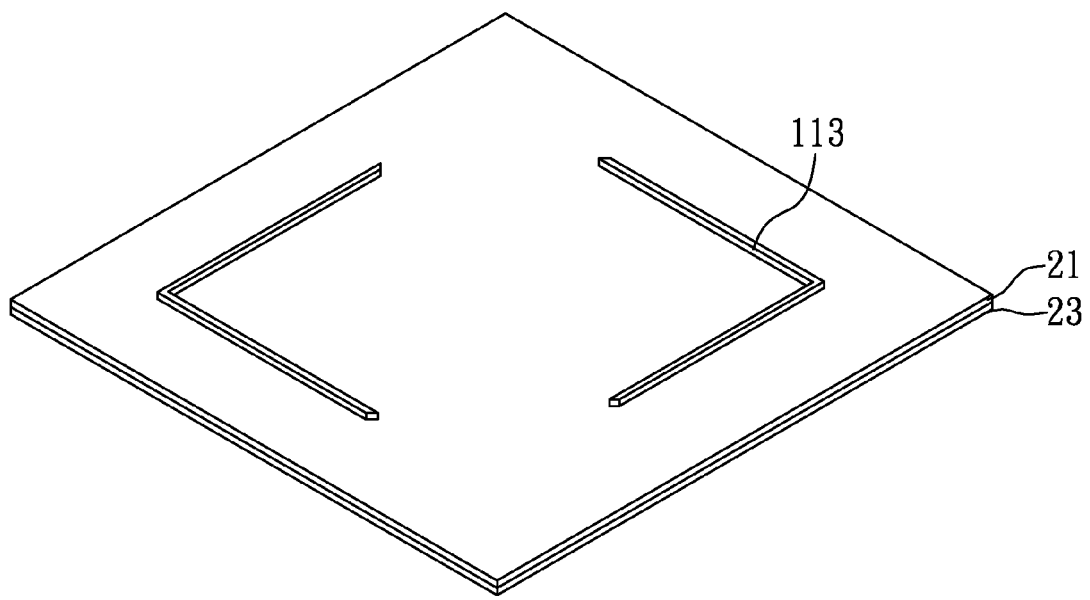
Figure 2E:
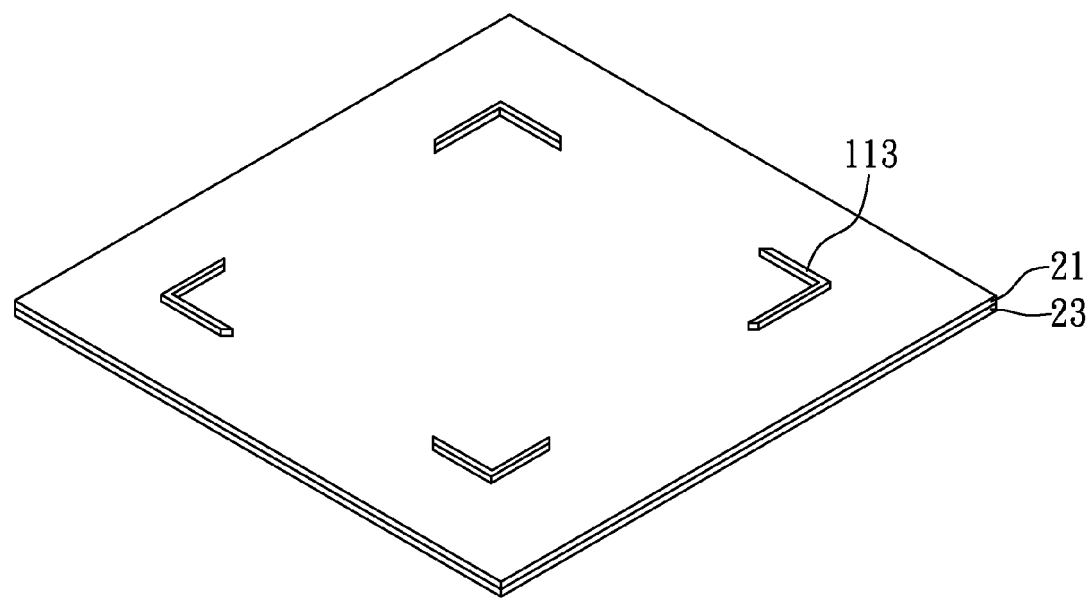

FIGS. 2B-2E are top views of other various stopper patterns for reference. For instance, stopper 113 may consist of a continuous or discontinuous strip and conform to four sides (as shown FIGS. 2B and 2C), two diagonal corners or four corners (as shown in FIGS. 2D and 2E) of a subsequently disposed semiconductor device.

FIGS. 3-8 are cross-sectional views showing a method of making an interconnect substrate that includes a semiconductor device, a stopper, a stiffener, a plated through hole, and dual build-up circuitries in accordance with an embodiment of the present invention.

Figure 8:
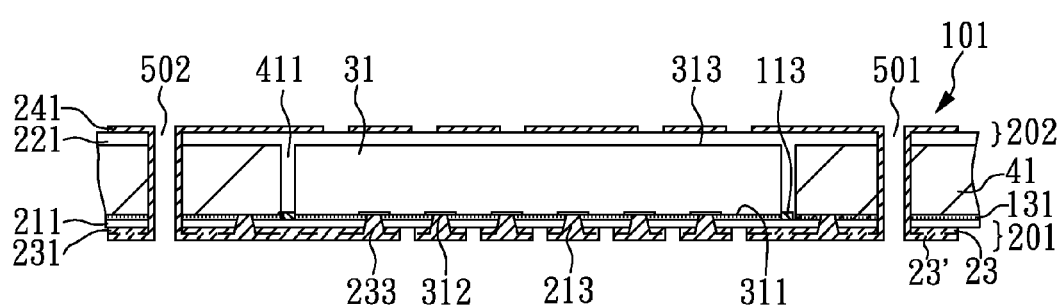

As shown in FIG. 8, interconnect substrate 101 includes semiconductor device 31, stopper 113, stiffener 41, plated through-hole 502 and dual build-up circuitries 201, 202. Semiconductor device 31 includes active surface 311, inactive surface 313 opposite to active surface 311, and contact pads 312 at active surface 311. First build-up circuitry 201 is electrically connected to contact pads 312 of semiconductor device 31 and includes first insulating layer 211 and first conductive traces 231, while second build-up circuitry 202 is electrically connected to the first build-up circuitry 201 via plated through-hole 502 and includes second insulating layer 221 and second conductive traces 241. Stopper 113 extends from first insulating layer 211 of first build-up circuitry 201 in the upward direction and is in close proximity to peripheral edges of semiconductor device 31. Stopper 113 as well as semiconductor device 31 are aligned with and extend into aperture 411 of stiffener 41.

Figure 3:
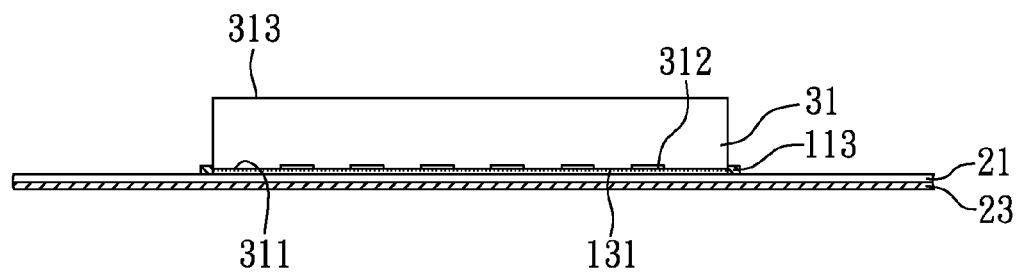
FIGS. 3 and 3A are cross-sectional and top views, respectively, of the structure with a semiconductor device mounted thereon in accordance with an embodiment of the present invention.
Figure 3A:
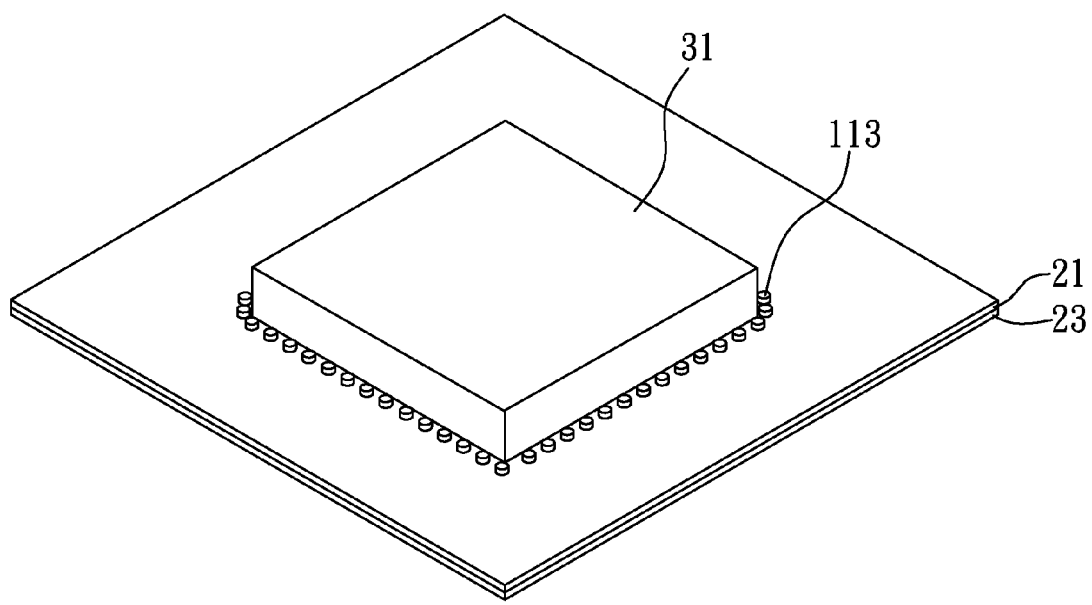

FIGS. 3 and 3A are cross-sectional and top views, respectively, of the structure with semiconductor device 31 such as a semiconductor chip mounted on dielectric layer 21 using adhesive 131. Semiconductor device 31 includes active surface 311, inactive surface 313 opposite to active surface 311, and contact pads 312 at active surface 311.

Stopper 113 can serve as a placement guide for semiconductor device 31, and thus semiconductor device 31 is precisely placed at a predetermined location with its active surface 311 facing dielectric layer 21. Stopper 113 extends from dielectric layer 21 beyond active surface 311 of semiconductor device 31 in the upward direction and is laterally aligned with and laterally extends beyond four sides of semiconductor device 31 in the lateral directions. As stopper 113 is in close proximity to and conforms to four lateral surfaces of semiconductor device 31 in lateral directions and adhesive 131 under semiconductor device 31 is lower than stopper 113, any undesirable movement of semiconductor device 31 due to adhesive curing can be avoided. Preferably, a gap in between semiconductor device 31 and stopper 113 is in a range of about 0.001 to 1 mm.

Figure 4:
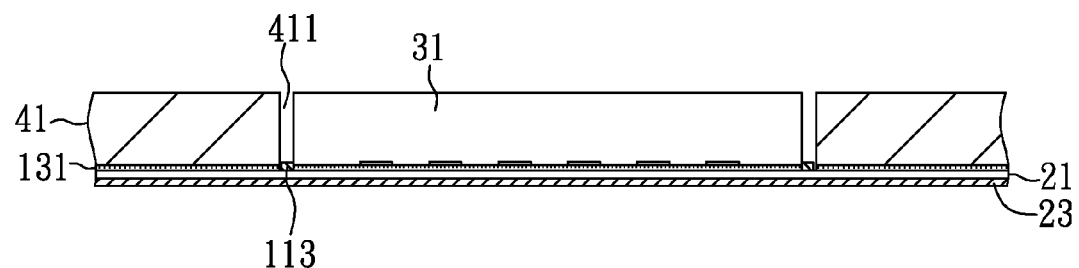
FIGS. 4 and 4A are cross-sectional and top views, respectively, of the structure with a stiffener mounted thereon in accordance with an embodiment of the present invention.
Figure 4A:
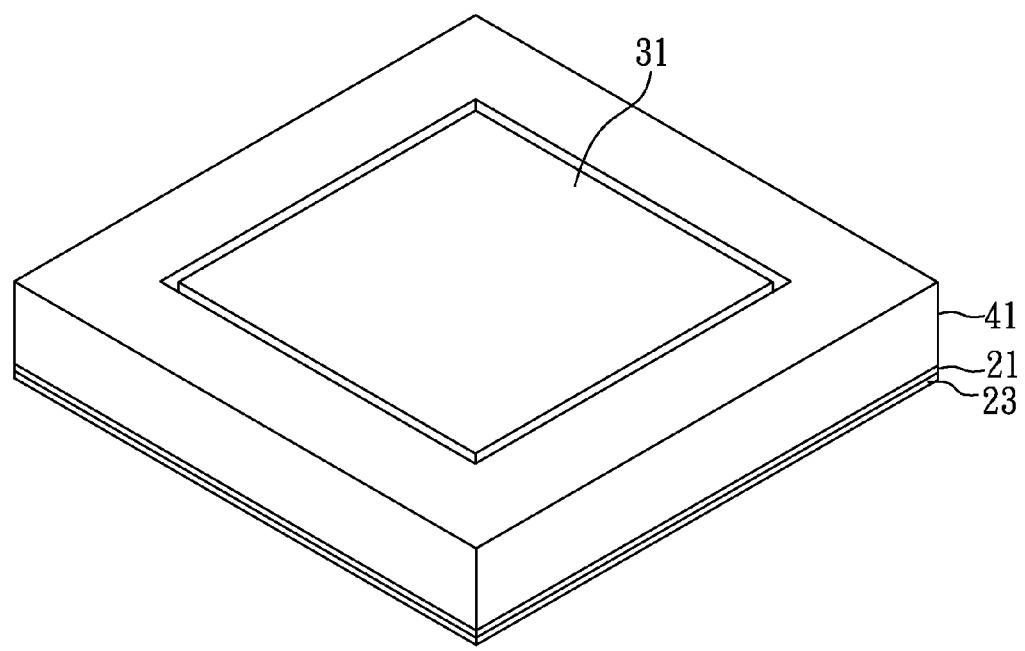

FIGS. 4 and 4A are cross-sectional and top views, respectively, of the structure with stiffener 41 mounted on dielectric layer 21 using adhesive 131. Semiconductor device 31 and stopper 113 are aligned with and inserted into aperture 411 of stiffener 41 and stiffener 41 is mounted on dielectric layer 21 using adhesive 131. Aperture 411 is formed by mechanical drilling through stiffener 41 and can be formed with other techniques such as punching and laser cutting. Stiffener 41 is illustrated as an epoxy sheet with a thickness of about the same to that of the semiconductor chip. The stiffener 41 can be other insulating layer such as glass, ceramic or multi-layer laminate structures, such as a multi-layer circuit board.

Semiconductor device 31 and the inner wall of aperture 411 are spaced from one another by stopper 113. Stopper 113 is in close proximity to and laterally aligned with four inner walls of aperture 411 and adhesive 113 under stiffener 41 is lower than stopper 113, and thus any undesirable movement of stiffener 41 also can be avoided before adhesive 131 is fully cured. Optionally, a bonding material (not shown in the figure) can be added between semiconductor device 31 and stiffener 41 to enhance rigidity.

Figure 5:
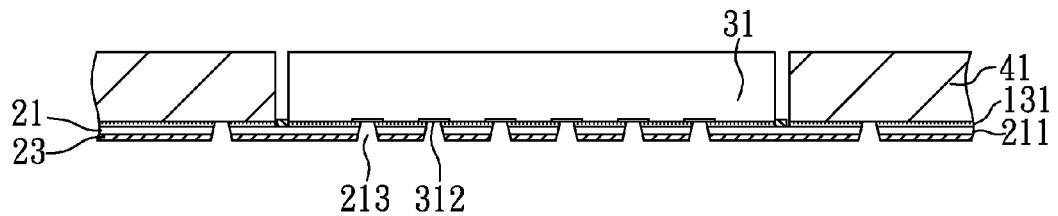
FIGS. 5-8 are cross-sectional views showing a method of making an interconnect substrate that includes a semiconductor device, a stiffener, dual build-up circuitries, a plated through-hole, and a stopper around the active surface of the embedded semiconductor device in accordance with an embodiment of the present invention.

FIG. 5 is a cross-sectional view of the structure showing first via openings 213 formed through adhesive 131, dielectric layer 21 and support plate 23 to expose contact pads 312 and selected portions of stiffener 41. First via openings 213 may be formed by numerous techniques including laser drilling, plasma etching and photolithography. Laser drilling can be enhanced by a pulsed laser. Alternatively, a scanning laser beam with a metal mask can be used. For instance, copper can be etched first to create a metal window followed by laser. First via openings 213 typically have a diameter of 50 microns, and dielectric layer 21 is considered first insulating layer 211 of build-up circuitry.

Figure 6:
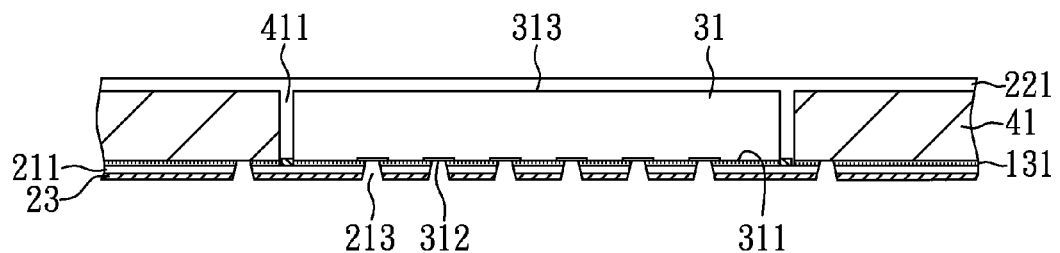

FIG. 6 is a cross-sectional view of the structure with second insulating layer 221 formed on inactive surface 313 of semiconductor device 31 and stiffener 41 in the upward direction. Second insulating layer 221 covers semiconductor device 31, stiffener 41 and stopper 113 in the upward direction, and extends into the gap between semiconductor device 31 and stiffener 41 in aperture 411. Second insulating layer 221 can be epoxy resin, glass-epoxy, polyimide and the like deposited by numerous techniques including film lamination, spin coating, roll coating, and spray-on deposition and typically has a thickness of 50 microns. Preferably, first insulating layer 211 and second insulating layer 221 are the same material.

Figure 7:
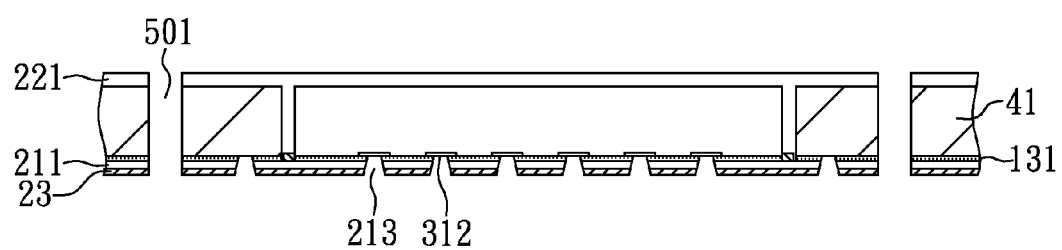

FIG. 7 is a cross-sectional view of the structure with through-holes 501. Through-holes 501 extend through second insulating layer 221, stiffener 41, adhesive 131, first insulating layer 211 and support plate 23 in the vertical direction. Through-holes 501 are formed by mechanical drilling and can be formed by other techniques such as laser drilling and plasma etching with or without wet etching.

Referring now to FIG. 8, first conductive traces 231 are formed on first insulating layer 211 by depositing plated layer 23' on support plate 23 and into first via openings 213, and then patterning support plate 23 and plated layer 23' thereon. Alternatively, in some embodiments which apply a laminate substrate without support plate 23 or remove support plate 23 after the step illustrated in FIG. 4, the dielectric layer 21 can be directly metallized to form first conductive traces 231 after forming first via openings 213 and through-holes 501. Meanwhile, second conductive traces 241 are formed on second insulating later 221 by depositing plated layer 23' on second insulating layer 221 and then patterning plated layer 23'. Also, plated layer 23' is further deposited as a connecting layer on the inner wall of through-holes 501 to provide plated through holes 502.

Plated layer 23' can be deposited by numerous techniques including electroplating, electroless plating, evaporating, sputtering, and their combinations as a single layer or multiple layers. For instance, plated layer 23' is deposited by first dipping the structure in an activator solution to render the insulating layer catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, support plate 23 and/or plated layer 23' can be patterned to form first conductive traces 231 and second conductive traces 241 by numerous techniques including wet etching, electro-chemical etching, laser-assist etching, and their combinations with an etch mask (not shown) thereon that defines first conductive traces 231 and second conductive traces 241, respectively.

Support plate 23 and plated layer 23' thereon are shown as a single layer for convenience of illustration. The boundary (shown in phantom) between the metal layers may be difficult or impossible to detect since copper is plated on copper. However, the boundary between plated layer 23' and first insulating layer 211, between plated layer 23' and second insulating layer 221, and between plated layer 23' and stiffener 41 is clear.

Accordingly, as shown in FIG. 8, interconnect substrate 101 is accomplished and includes semiconductor device 31, stopper 113, stiffener 41, dual build-up circuitries 201, 202 and plated through-holes 502. In this illustration, first build-up circuitry 201 includes first insulating layer 211 and first conductive traces 231, while second build-up circuitry 202 includes second insulating layer 221 and second conductive traces 241. Stopper 113 extends from first insulating layer 211 of first build-up circuitry 201 and extends beyond active surface 311 of semiconductor device 31 in the upward direction to accurately confine the placement location of semiconductor device 31. First conductive traces 231 extend from first insulating layer 211 in the downward direction, extend laterally on first insulating layer 211 and extend into first via openings 213 in the upward direction to form first conductive vias 233 in electrical contact with contact pads 312 and stiffener 41. Second conductive traces 241 extend from second insulating layer 221 in the upward direction and extend laterally on second insulating layer 221. Plated through holes 502 extend through stiffener 41 in the vertical directions to provide electrical connection between first conductive traces 231 and second conductive traces 241.

Figure 9:
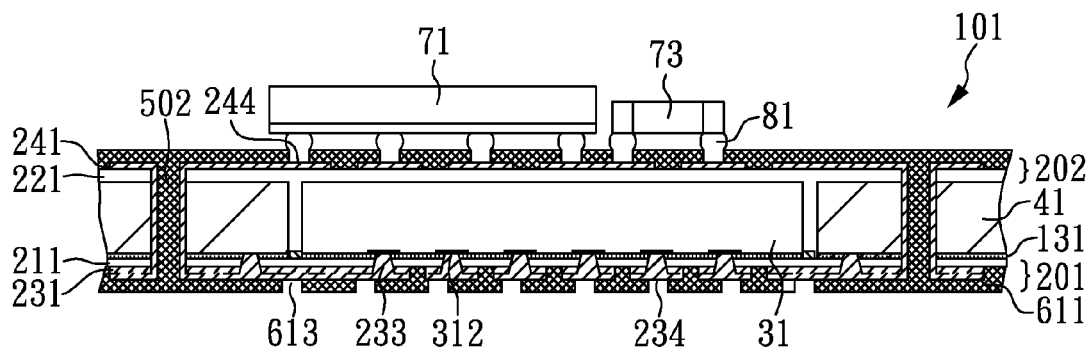
FIG. 9 is a cross-sectional view of a three dimensional stacked semiconductor assembly that includes an interconnect substrate with an embedded semiconductor device and another semiconductor device electrically connected to the build-up circuitry of the interconnect substrate through solder bumps in accordance with an embodiment of the present invention.

FIG. 9 is a cross-sectional view of a three-dimensional semiconductor assembly in which another semiconductor devices 71, 73 are attached to the interconnect substrate 101 at second build-up circuitry 202 via solder bumps 81 on second interconnect pads 244 exposed by solder mask material 611. In this illustration, solder mask material 611 is disposed over first build-up circuitry 201 and second build-up circuitry 202, fills the remaining space in plated through-hole 502 and includes solder mask openings 613 that are aligned with first and second interconnect pads 234, 244. External semiconductor devices 71, 73 can be electrically connected to the embedded semiconductor device 31 through second build-up circuitry 202, plated through-hole 502 and first build-up circuitry 201. Additionally, first interconnect pads 234 of first build-up circuitry 201 can accommodate a conductive joint, such as solder bump, solder ball, pin and the like for electrical communication and mechanical attachment with external components or a PCB. Herein, solder mask openings 613 may be formed by numerous techniques including photolithography, laser drilling and plasma etching, and solder bumps 81 can be provided by numerous techniques including screen printing solder paste followed by a reflow process or by electroplating.

[Embodiment 2]

Figure 10:
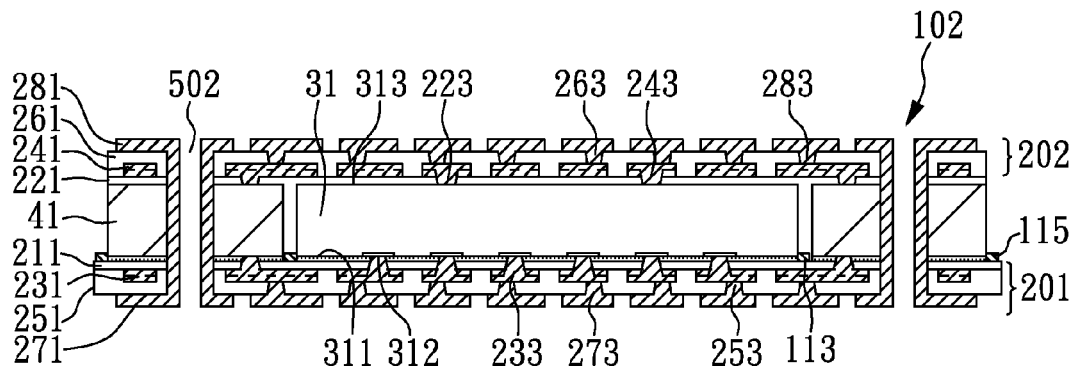
FIGS. 10 and 10A are cross-sectional and top views, respectively, of another interconnect substrate that includes a semiconductor device, a stopper, a placement guide, a stiffener, dual build-up circuitries and a plated through-hole in accordance with another embodiment of the present invention.
Figure 10A:
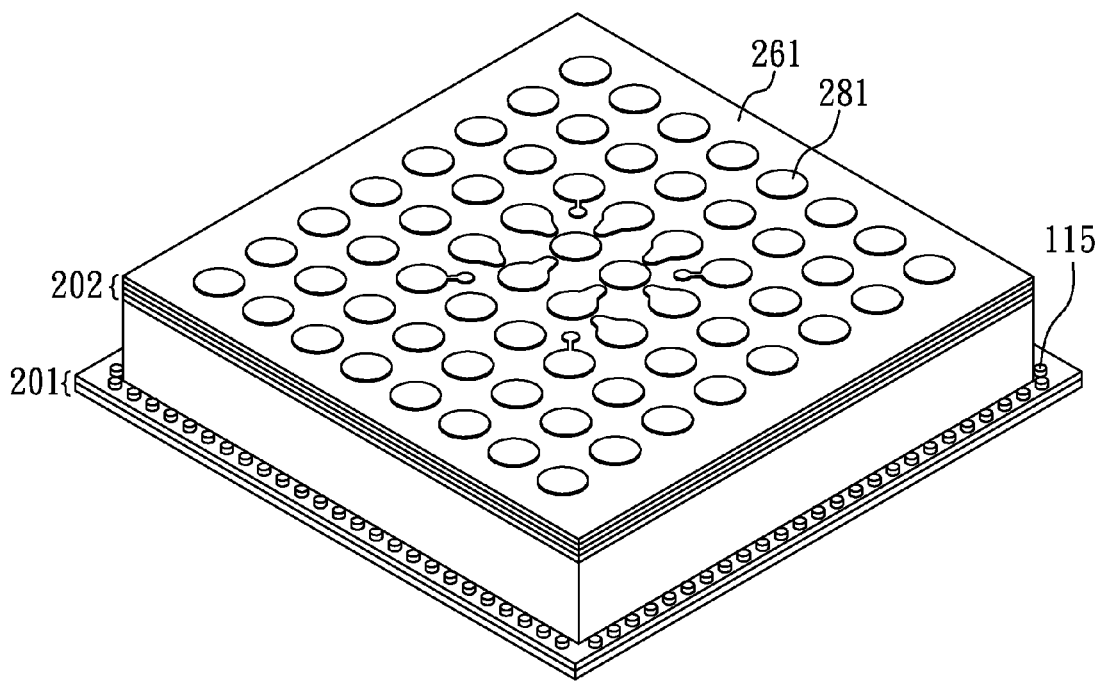

FIGS. 10 and 10A are cross-sectional and top views, respectively, of another interconnect substrate 102 with placement guide 115 in close proximity to the outer peripheral edges of stiffener 41 and second conductive vias 243 in direct contact with inactive surface 313 of semiconductor device 31 and stiffener 41 in accordance with another embodiment of the present invention.

In this embodiment, interconnect substrate 102 is manufactured in a manner similar to that illustrated in Embodiment 1, except that placement guide 115 is simultaneously formed during stopper 113 formation by removing selected portions of metal layer 11 to accurately confine the placement location of stiffener 41 and second conductive vias 243 are formed in direct contact with inactive surface 313 of semiconductor device 31 and stiffener 41. Herein, first build-up circuitry 201 includes first insulating layer 211, first conductive traces 231, third insulating layer 251 and third conductive traces 271, while second build-up circuitry 202 includes second insulating layer 221, second conductive traces 241, fourth insulating layer 261 and fourth conductive traces 281. First conductive traces 231 extends from first insulating layer 211 in the downward direction and extends into first via openings 213 in the upward direction to form first conductive vias 233 in direct contact with contact pads 312 and stiffener 41, while second conductive traces 241 extends from second insulating layer 221 in the upward direction and extends into second via openings 223 in the downward direction to form second conductive vias 243 in direct contact with inactive surface 313 and stiffener 41. Third insulating layer 251 extends from and covers first insulating layer 211 and first conductive traces 231 in the downward direction, while fourth insulating layer 261 extends from and covers second insulating layer 221 and second conductive traces 241 in the upward direction. Third conductive traces 271 extends from third insulating layer 251 in the downward direction and extends into third via openings 253 in the upward direction to form third conductive vias 273 in direct contact with first conductive traces 231, while fourth conductive traces 281 extends from fourth insulating layer 261 in the upward direction and extends into fourth via openings 263 in the downward direction to form fourth conductive vias 283 in direct contact with second conductive traces 241. Plated through-holes 502 extend through fourth insulating layer 261, second insulating layer 221, stiffener 41, adhesive 131, first insulating layer 211 and third insulating layer 251 in the vertical directions to provide an electrical connection between third conductive traces 271 and fourth conductive traces 281.

As shown in FIG. 10A, the placement location of stiffener 41 is accurately confined by placement guide 115 that extends from first insulating layer 211 beyond the attached surface of stiffener 41 in the upward direction and is laterally aligned with and laterally extends beyond four outer lateral surfaces of stiffener 41 in the lateral directions. Placement guide 115 is illustrated as plural metal posts and conforms to four outer sides of stiffener 41 in lateral directions. However, placement guide 115 is not limited to the illustrated pattern and can be designed in other various patterns. As placement guide 115 is in close proximity to and conforms to four outer lateral surfaces of stiffener 41 in lateral directions and adhesive 131 under stiffener 41 is lower than placement guide 115, any undesirable movement of stiffener 41 due to adhesive curing can be avoided. Preferably, a gap in between the outer peripheral edges of stiffener 41 and placement guide 115 is in a range of about 0.001 to 1 mm.

[Embodiment 3]

FIGS. 11-16 are cross-section views showing a method of making yet another interconnect substrate with the stopper around the inactive surface of the semiconductor device in accordance with yet another embodiment of the present invention.

For purposes of brevity, any description in Embodiment 1 is incorporated herein insofar as the same is applicable, and the same description need not be repeated.

Figure 11:
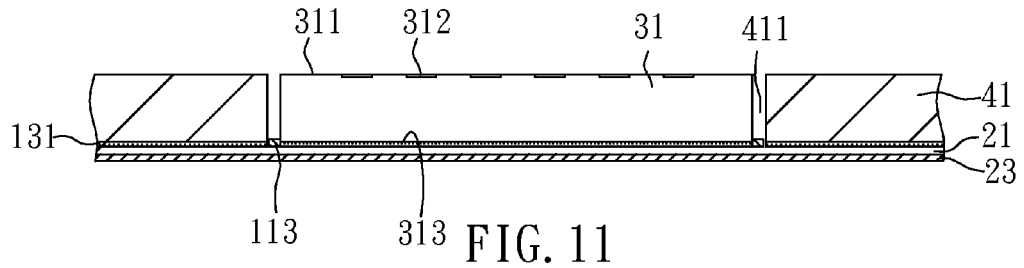
FIGS. 11-16 are cross-sectional views showing a method of making yet another interconnect substrate that includes a semiconductor device, a stiffener, dual build-up circuitries, a plated through-hole, and a stopper around the inactive surface of the semiconductor device in accordance with yet another embodiment of the present invention.

FIG. 11 is a cross-sectional view of the structure which is manufactured by the same steps shown in FIGS. 1-4, except that semiconductor device 31 is mounted on dielectric layer 21 with its inactive surface 313 facing dielectric layer 21.

Figure 12:
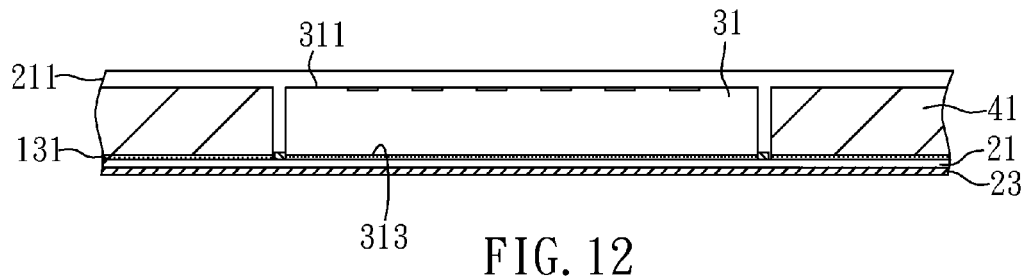

FIG. 12 is a cross-sectional view of the structure with first insulating layer 211 formed on active surface 311 of semiconductor device 31 and stiffener 41 in the upward direction. First insulating layer 211 covers semiconductor device 31, stiffener 41 and stopper 113 in the upward direction, and extends into the gap between semiconductor device 31 and stiffener 41 in aperture 411.

Figure 13:
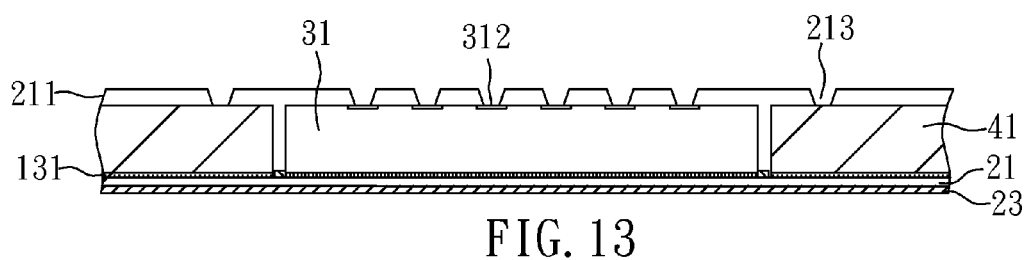

FIG. 13 is a cross-sectional view of the structure showing first via openings 213 formed through first insulating layer 211. First via openings 213 are aligned with and expose contact pads 312 of semiconductor device 31 and selected portions of stiffener 41.

Figure 14:
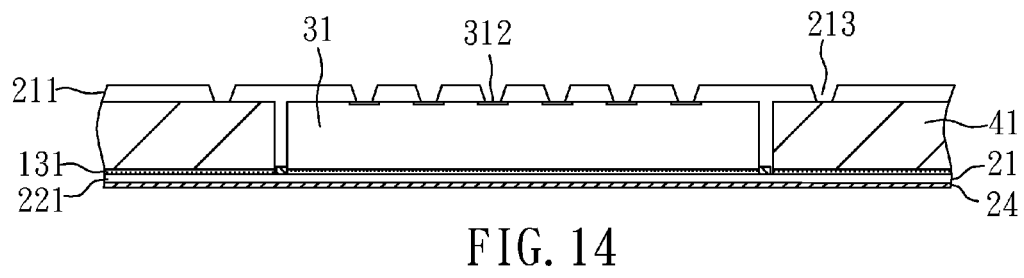
Figure 14:
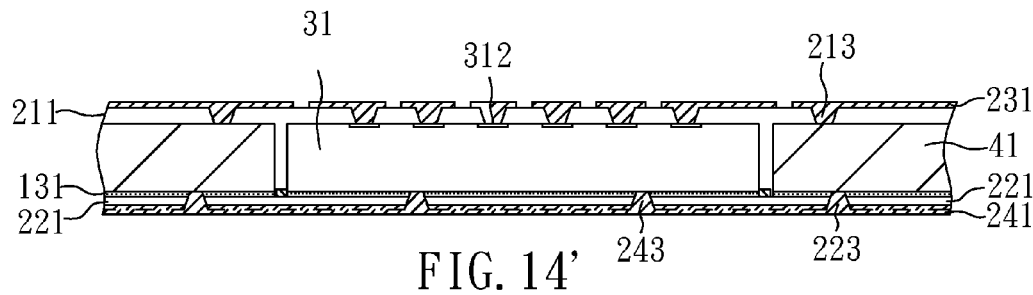

FIG. 14 is a cross-sectional view of the structure in which support plate 23 is thinned to form metal layer 24 with a desired thickness. Metal layer 24 is illustrated as a copper layer with a thickness of about 15 microns, and dielectric layer 21 is considered as second insulating layer 221 of build-up circuitry.

FIG. 14' is a cross-sectional view of the structure with optional first conductive traces 231 and second conductive trace 241. First conductive traces 231 are formed on first insulating layer 211 by depositing plated layer on first insulating layer 211 and into first via openings 213, and then pattern the plated layer. Second conductive traces 241 are formed on a second insulating layer by the steps of: forming second via openings 223 that extend through metal layer 24, second insulating layer 221 and adhesive 131; and then forming the second conductive trace 241 be depositing a metal layer that extends through the second via opening 223 in the first vertical direction to form second conductive vias 243 in direct contact with the inactive surface of the semiconductor device 31 and the stiffener 41.

Figure 15:
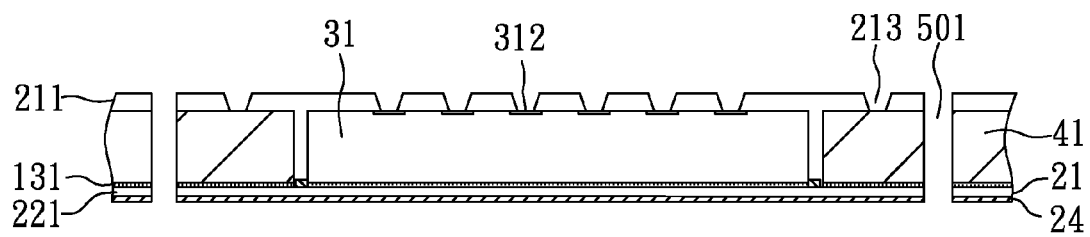

FIG. 15 is a cross-sectional view of the structure with through-holes 501. Through-holes 501 extend through first insulating layer 211, stiffener 41, adhesive 131, second insulating layer 221 and metal layer 24 in the vertical direction.

Figure 16:
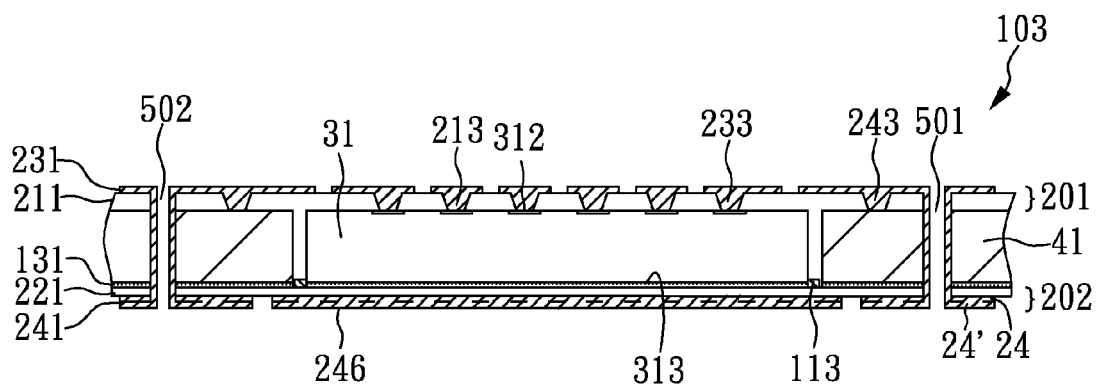

Referring now to FIG. 16, first conductive traces 231 are formed on first insulating layer 211 by depositing plated layer 24' on first insulating layer 211 and into first via openings 213 and then patterning plated layer 24'. Meanwhile, second conductive traces 241 and paddle layer 246 are formed on second insulating later 221 by depositing plated layer 24' on metal layer 24 and then patterning metal layer 24 and plated layer 24' thereon. Also, plated layer 24' is further deposited as a connecting layer on the inner wall of through-holes 501 to provide plated through holes 502.

Metal layer 24 and plated layer 24' thereon are shown as a single layer for convenience of illustration. The boundary (shown in phantom) between the metal layers may be difficult or impossible to detect since copper is plated on copper. However, the boundary between plated layer 24' and first insulating layer 211, between plated layer 24' and second insulating layer 221, and between plated layer 24' and stiffener 41 is clear.

Accordingly, as shown in FIG. 16, interconnect substrate 103 is accomplished and includes semiconductor device 31, stopper 113, stiffener 41, dual build-up circuitries 201, 202 and plated through-holes 502. In this illustration, first build-up circuitry 201 includes first insulating layer 211 and first conductive traces 231, while second build-up circuitry 202 includes second insulating layer 221, second conductive traces 241 and paddle layer 246. Stopper 113 extends from second insulating layer 221 of second build-up circuitry 202 and extends beyond inactive surface 313 of semiconductor device 31 in the upward direction to accurately confine the placement location of semiconductor device 31. First conductive traces 231 extend from first insulating layer 211 in the upward direction, extend laterally on first insulating layer 211 and extend into first via openings 213 in the downward direction to form first conductive vias 233 in electrical contact with contact pads 312 and stiffener 41. Second conductive traces 241 and paddle layer 246 extend from second insulating layer 221 in the downward direction and extend laterally on second insulating layer 221. Plated through holes 502 extend through stiffener 41 in the vertical directions to provide electrical connection between first conductive traces 231 and second conductive traces 241.

Figure 17:
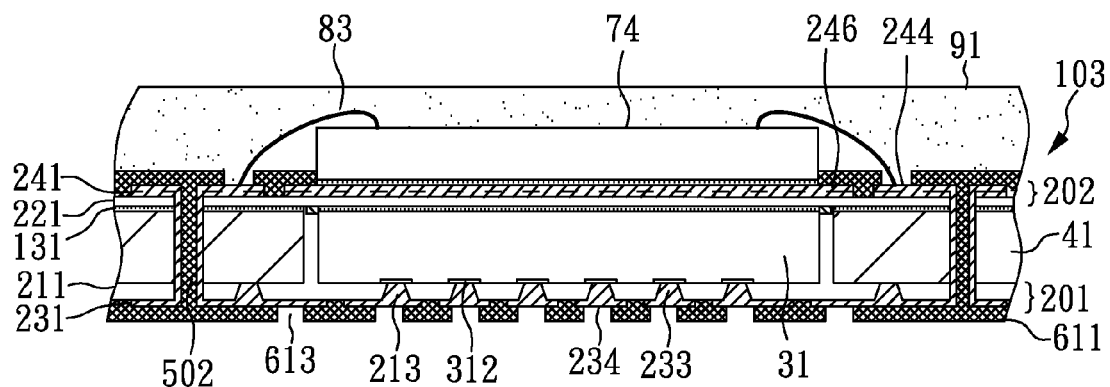
FIG. 17 is a cross-sectional view of another three dimensional stacked semiconductor assembly that includes an interconnect substrate with an embedded semiconductor device and another semiconductor device electrically connected to the build-up circuitry of the substrate through wire bonds in accordance with another embodiment of the present invention.

FIG. 17 is a cross-sectional view of a three-dimensional semiconductor assembly in which another semiconductor device 74 is attached to interconnect substrate 103 at paddle layer 246 of second build-up circuitry 202 and is electrically connected to second conductive traces 241 via wire bonds 83. In this illustration, solder mask material 611 is disposed over first build-up circuitry 201 and second build-up circuitry 202, fills the remaining space in plated through-hole 502 and includes solder mask openings 613 that are aligned with first and second interconnect pads 234, 244 as well as selected portions of paddle layer 264. Semiconductor device 74 on paddle layer 246 can be electrically connected to the embedded semiconductor device 31 through wire bonds 83, second build-up circuitry 202, plated through-hole 502 and first build-up circuitry 201. Additionally, encapsulant 91 such as molding compound can be applied to protect semiconductor device 74 and wire bonds 83.

The interconnect substrates and three-dimensional semiconductor assemblies described above are merely exemplary. Numerous other embodiments are contemplated. In addition, the embodiments described above can be mixed-and-matched with one another and with other embodiments depending on design and reliability considerations. For instance, the interconnect substrate may include multiple sets of stoppers to accurately define the relative positions of multiple additional semiconductor devices, passive components or other electronic devices, and the build-up circuitry can include additional conductive traces to accommodate additional semiconductor devices, passive components or other electronic devices. Likewise, the stiffener can include multiple apertures to accommodate additional semiconductor devices, passive components or other electronic devices.

The semiconductor device can be a packaged or unpackaged chip. Furthermore, the semiconductor device can be a bare chip, LGA, or QFN, etc. The stopper can be customized for the semiconductor device. For instance, the stopper can have a pattern that defines a square or rectangular area with the same or similar topography as the semiconductor device.

The term "adjacent" refers to elements that are integral (single-piece) or in contact (not spaced or separated from) with one another. For instance, the first conductive trace is adjacent to the active surface but not the inactive surface.

The term "overlap" refers to above and extending within a periphery of an underlying element. Overlap includes extending inside and outside the periphery or residing within the periphery. For instance, in the position that the stopper extends from the dielectric layer in the upward direction, the stiffener overlaps the dielectric layer since an imaginary vertical line intersects the stiffener and the dielectric layer, regardless of whether another element such as the adhesive is between the stiffener and the dielectric layer and is intersected by the line, and regardless of whether another imaginary vertical line intersects the dielectric layer but not the stiffener (within the aperture of the stiffener). Likewise, the adhesive overlaps the dielectric layer, the stiffener overlaps the adhesive and the adhesive is overlapped by the stiffener. Moreover, overlap is synonymous with over and overlapped by is synonymous with under or beneath.

The term "contact" refers to direct contact. For instance, the conductive trace contacts the active surface but not the inactive surface.

The term "cover" refers to incomplete and complete coverage in a vertical and/or lateral direction. For instance, in the position that the inactive surface of the semiconductor device faces the upward direction, the first build-up circuitry covers the semiconductor device in the downward direction regardless of whether another element such as the adhesive is between the semiconductor device and the first build-up circuitry, and the second build-up circuitry cover the semiconductor device in the upward direction.

The term "layer" refers to patterned and un-patterned layers. For instance, the metal layer of the laminate substrate can be an un-patterned blanket sheet before photolithography and wet etching. Furthermore, a layer can include stacked layers.

The terms "opening" and "aperture" and "hole" refer to a through hole and are synonymous. For instance, in the position that the stopper extends from the dielectric layer in the upward direction, the semiconductor device is exposed by the stiffener in the upward direction when it is inserted into the aperture in the stiffener.

The term "inserted" refers to relative motion between elements. For instance, the semiconductor device is inserted into the aperture regardless of whether the stiffener is stationary and the semiconductor device moves towards the stiffener, the semiconductor device is stationary and the stiffener moves towards the semiconductor device or the semiconductor device and the stiffener both approach the other. Furthermore, the semiconductor device is inserted (or extends) into the aperture regardless of whether it goes through (enters and exits) or does not go through (enters without exiting) the aperture.

The phrase "aligned with" refers to relative position between elements regardless of whether elements are spaced from or adjacent to one another or one element is inserted into and extends into the other element. For instance, the stopper is laterally aligned with the semiconductor device since an imaginary horizontal line intersects the stopper and the semiconductor device, regardless of whether another element is between the stopper and the semiconductor device and is intersected by the line, and regardless of whether another imaginary horizontal line intersects the semiconductor device but not the stopper or intersects the stopper but not the semiconductor device. Likewise, the first via opening is aligned with the contact pads of the semiconductor device, and the semiconductor device and the stopper are aligned with the aperture.

The phrase "in close proximity to" refers to a gap between elements not being wider than the maximum acceptable limit. As known in the art, when the gap between the semiconductor device and the stopper is not narrow enough, the location error of the semiconductor device due to the lateral displacement of the semiconductor device within the gap may exceed the maximum acceptable error limit. Once the location error of the semiconductor device goes beyond the maximum limit, it is impossible to align the contact pad with a laser beam, resulting in the electrical connection failure between the semiconductor device and the build-up circuitry. According to the pad size of the semiconductor device, those skilled in the art can ascertain the maximum acceptable limit for a gap between the semiconductor device and the stopper through trial and error to prevent the electrical connection failure between the semiconductor device and the build-up circuitry. Thereby, the description "the stopper is in close proximity to the peripheral edges of the semiconductor device" means that the gap between the peripheral edges of the semiconductor device and the stopper is narrow enough to prevent the location error of the semiconductor device from exceeding the maximum acceptable error limit.

The phrase "mounted on" includes contact and non-contact with a single or multiple support element(s). For instance, the semiconductor device is mounted on the dielectric layer regardless of whether it contacts the dielectric layer or is separated from the dielectric layer by an adhesive.

The phrase "electrical connection" or "electrically connects" or "electrically connected" refers to direct and indirect electrical connection. For instance, the plated through-hole provides an electrical connection for first conductive trace regardless of whether it is adjacent to the first conductive trace or electrically connected to the first conductive trace by the third conductive trace.

The term "above" refers to upward extension and includes adjacent and non-adjacent elements as well as overlapping and non-overlapping elements. For instance, in the position that the active surface faces the downward direction and is attached to the dielectric layer, the stopper extends above, is adjacent to and protrudes from the dielectric layer.

The term "below" refers to downward extension and includes adjacent and non-adjacent elements as well as overlapping and non-overlapping elements. For instance, in the position that the active surface faces the downward direction and is attached to the dielectric layer, the first build-up circuitry extends below, is adjacent to and protrudes from the adhesive in the downward direction. Likewise, the first build-up circuitry extends below the semiconductor device even though it is not adjacent to the semiconductor device.

The "first vertical direction" and "second vertical direction" do not depend on the orientation of the interconnect substrate, as will be readily apparent to those skilled in the art. For instance, the active surface of the semiconductor device faces the first vertical direction and the inactive surface of the semiconductor device faces the second vertical direction regardless of whether the interconnect substrate is inverted. Likewise, the stopper is "laterally" aligned with the semiconductor device in a lateral plane regardless of whether the interconnect substrate is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the downward direction and the second vertical direction is the upward direction in the position that the active surface of the semiconductor device faces the downward direction, and the first vertical direction is the upward direction and the second vertical direction is the downward direction in the position that the active surface of the semiconductor device faces the upward direction.

The interconnect substrate and the semiconductor assembly using the same according to the present invention have numerous advantages. The interconnect substrate made by this method and the semiconductor assembly using the same are reliable, inexpensive and well-suited for high volume manufacture. The stiffener provides the mechanical support, dimensional stability and controls the overall flatness and the thermal expansion of the build-up circuitry such that the semiconductor device can be securely connected to the build-up circuitry under thermal cycling even though the coefficient of thermal expansion (CTE) between them may be different. The direct electrical connection without solder between the semiconductor device and the build-up circuitry is advantageous to high I/O and high performance. Particularly, the stopper can accurately confine the placement location of the semiconductor device and avoid the electrical connection failure between the semiconductor device and the build-up circuitry resulted from the lateral displacement of the semiconductor device, thereby improving the manufacturing yield greatly.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional packaging techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

Although the present invention has been explained in relation to its preferred embodiment, it is to be understood that many other possible modifications and variations can be made without departing from the spirit and scope of the invention as hereinafter claimed.

We claim:

1. A method of making an interconnect substrate with an embedded device and a built-in stopper, comprising:
   forming a stopper on a dielectric layer; which includes:
      providing a laminate substrate that includes a metal layer and the dielectric layer; and then removing a selected portion of the metal layer to form the stopper;

mounting a semiconductor device on the dielectric layer using the stopper as a placement guide for the semiconductor device that includes an active surface with a contact pad thereon and an inactive surface, wherein the active surface faces a first vertical direction, the inactive surface faces a second vertical direction opposite the first vertical direction, and the stopper is located in close proximity to and laterally aligned with and laterally extends beyond peripheral edges of the semiconductor device in lateral directions orthogonal to the vertical directions;

attaching a stiffener to the dielectric layer, including aligning the semiconductor device and the stopper within an aperture of the stiffener;

forming a first build-up circuitry that covers the stopper, the semiconductor device and the stiffener in the first vertical direction and includes a first conductive via that directly contacts the contact pad of the semiconductor device to provide an electrical connection between the semiconductor device and the first build-up circuitry;

forming a second build-up circuitry that covers the stopper, the semiconductor device and the stiffener in the second vertical direction; and providing a plated through-hole that extends through the stiffener in the vertical directions to provide an electrical connection between the first build-up circuitry and the second build-up circuitry.

2. The method of claim 1, wherein the electrical connection between the semiconductor device and the first build-up circuitry is devoid of solder.

3. The method of claim 1, wherein the semiconductor device is mounted on the dielectric layer with the active surface facing the dielectric layer and the stopper extends from the dielectric layer in the second vertical direction.

4. The method of claim 3, wherein the semiconductor device is attached to the dielectric layer using an adhesive that contacts and is sandwiched between the semiconductor device and the dielectric layer.

5. The method of claim 4, wherein the adhesive contacts and is coplanar with the stopper in the first vertical direction and is lower than the stopper in the second vertical direction.

6. The method of claim 4, wherein the forming the first build-up circuitry and the second build-up circuitry includes:
providing a first insulating layer that includes the dielectric layer and covers the stopper, the semiconductor device and the stiffener in the first vertical direction;
providing a second insulating layer that covers the stopper, the semiconductor device and the stiffener in the second vertical direction;
forming a first via opening that extends through the first insulating layer and the adhesive and is aligned with the contact pad of the semiconductor device;
forming a first conductive trace that extends from the first insulating layer in the first vertical direction and extends laterally on the first insulating layer and extends through the first via opening in the second vertical direction to form the first conductive via in direct contact with the contact pad of the semiconductor device; and
forming a second conductive trace that extends from the second insulating layer in the second vertical direction and extends laterally on the second insulating layer.

7. The method of claim 6, wherein the forming the first build-up circuitry includes:

forming an additional first via opening that extends through the first insulating layer and is aligned with the stiffener; and then
forming the first conductive trace that extends through the additional first via opening in the second vertical direction to form an additional first conductive via in direct contact with the stiffener.

8. The method of claim 6, wherein the forming the second build-up circuitry includes:
forming second via openings that extend through the second insulating layer and are aligned with the inactive surface of the semiconductor device and the stiffener; and then
forming the second conductive trace that extends through the second via openings in the first vertical direction to form second conductive vias in direct contact with the inactive surface of the semiconductor device and the stiffener.

9. The method of claim 1, wherein the semiconductor device is mounted on the dielectric layer with the inactive surface facing the dielectric layer and the stopper extends from the dielectric layer in the first vertical direction.

10. The method of claim 9, the semiconductor device is attached to the dielectric layer using an adhesive that contacts and is sandwiched between the semiconductor device and the dielectric layer.

11. The method of claim 10, wherein the adhesive contacts and is coplanar with the stopper in the second vertical direction and is lower than the stopper in the first vertical direction.

12. The method of claim 10, wherein the forming the first build-up circuitry and the second build-up circuitry includes:
providing a first insulating layer that covers the stopper, the semiconductor device and the stiffener in the first vertical direction;
providing a second insulating layer that includes the dielectric layer and covers the stopper, the semiconductor device and the stiffener in the second vertical direction;
forming a first via opening that extends through the first insulating layer and is aligned with the contact pad of the semiconductor device;
forming a first conductive trace that extends from the first insulating layer in the first vertical direction and extends laterally on the first insulating layer and extends through the first via opening in the second vertical direction to form the first conductive via in direct contact with the contact pad of the semiconductor device; and
forming a second conductive trace that extends from the second insulating layer in the second vertical direction and extends laterally on the second insulating layer.

13. The method of claim 12, wherein the forming the first build-up circuitry includes:
forming an additional first via opening in the first insulating layer that extends through the first insulating layer and is aligned with the stiffener; and then
forming the first conductive trace that extends through the additional first via opening in the second vertical direction to form an additional first conductive via in direct contact with the stiffener.

14. The method of claim 12, wherein the forming the second build-up circuitry includes:
forming second via openings that extend through the second insulating layer and the adhesive and are aligned with the inactive surface of the semiconductor device and the stiffener; and then
forming the second conductive trace that extends through the second via openings in the first vertical direction to form second conductive vias in direct contact with the inactive surface of the semiconductor device and the stiffener.

15. The method of claim 1, wherein the providing the plated through-hole includes:
forming a through-hole that extends through the stiffener and the dielectric layer in the vertical directions; and then
depositing a connecting layer on an inner sidewall of the through-hole.

16. The method of claim 1, wherein the stopper include a continuous or discontinuous strip or an array of posts.

17. The method of claim 1, wherein a gap in between the semiconductor device and the stopper is in a range of 0.001 to 1 mm.

18. The method of claim 1, wherein the stopper has a height in a range of 10 to 200 microns.

19. The method of claim 1, wherein the stiffener is a laminated epoxy or polyimide.

20. The method of claim 1, wherein the semiconductor device is mounted on the dielectric layer with the inactive surface facing the dielectric layer and the stopper extends from the dielectric layer in the first vertical direction.

21. The method of claim 20, the semiconductor device is attached to the dielectric layer using an adhesive that contacts and is sandwiched between the semiconductor device and the dielectric layer.

22. The method of claim 21, wherein the adhesive contacts and is coplanar with the stopper in the second vertical direction and is lower than the stopper in the first vertical direction.

23. The method of claim 20, wherein the forming the first build-up circuitry and the second build-up circuitry includes:
providing a first insulating layer that covers the stopper, the semiconductor device and the stiffener in the first vertical direction;
providing a second insulating layer that includes the dielectric layer and covers the stopper, the semiconductor device and the stiffener in the second vertical direction;
forming a first via opening that extends through the first insulating layer and is aligned with the contact pad of the semiconductor device;
forming a first conductive trace that extends from the first insulating layer in the first vertical direction and extends laterally on the first insulating layer and extends through the first via opening in the second vertical direction to form the first conductive via in direct contact with the contact pad of the semiconductor device; and
forming a second conductive trace that extends from the second insulating layer in the second vertical direction and extends laterally on the second insulating layer.

24. The method of claim 23, wherein the forming the first build-up circuitry includes:
forming an additional first via opening in the first insulating layer that extends through the first insulating layer and is aligned with the stiffener; and then
forming the first conductive trace that extends through the additional first via opening in the second vertical direction to form an additional first conductive via in direct contact with the stiffener.

25. The method of claim 23, wherein the forming the second build-up circuitry includes:
forming second via openings that extend through the second insulating layer and the adhesive and are aligned with the inactive surface of the semiconductor device and the stiffener; and then
forming the second conductive trace that extends through the second via openings in the first vertical direction to form second conductive vias in direct contact with the inactive surface of the semiconductor device and the stiffener.

26. A method of making an interconnect substrate with an embedded device and a built-in stopper, comprising:
forming a stopper on a dielectric layer; which includes: providing a laminate substrate that includes a metal layer and the dielectric layer; then removing a selected portion of the metal layer to form a recessed portion; then depositing a plastic material into the recessed portion; and then removing a remaining portion of the metal layer;
mounting a semiconductor device on the dielectric layer using the stopper as a placement guide for the semiconductor device that includes an active surface with a contact pad thereon and an inactive surface, wherein the active surface faces a first vertical direction, the inactive surface faces a second vertical direction opposite the first vertical direction, and the stopper is located in close proximity to and laterally aligned with and laterally extends beyond peripheral edges of the semiconductor device in lateral directions orthogonal to the vertical directions;
attaching a stiffener to the dielectric layer, including aligning the semiconductor device and the stopper within an aperture of the stiffener;
forming a first build-up circuitry that covers the stopper, the semiconductor device and the stiffener in the first vertical direction and includes a first conductive via that directly contacts the contact pad of the semiconductor device to provide an electrical connection between the semiconductor device and the first build-up circuitry;
forming a second build-up circuitry that covers the stopper, the semiconductor device and the stiffener in the second vertical direction; and
providing a plated through-hole that extends through the stiffener in the vertical directions to provide an electrical connection between the first build-up circuitry and the second build-up circuitry.

27. The method of claim 26, wherein the electrical connection between the semiconductor device and the first build-up circuitry is devoid of solder.

28. The method of claim 26, wherein the semiconductor device is mounted on the dielectric layer with the active surface facing the dielectric layer and the stopper extends from the dielectric layer in the second vertical direction.

29. The method of claim 28, wherein the semiconductor device is attached to the dielectric layer using an adhesive that contacts and is sandwiched between the semiconductor device and the dielectric layer.

30. The method of claim 29, wherein the adhesive contacts and is coplanar with the stopper in the first vertical direction and is lower than the stopper in the second vertical direction.

31. The method of claim 29, wherein the forming the first build-up circuitry and the second build-up circuitry includes:
providing a first insulating layer that includes the dielectric layer and covers the stopper, the semiconductor device and the stiffener in the first vertical direction;
providing a second insulating layer that covers the stopper, the semiconductor device and the stiffener in the second vertical direction;
forming a first via opening that extends through the first insulating layer and the adhesive and is aligned with the contact pad of the semiconductor device;

forming a first conductive trace that extends from the first insulating layer in the first vertical direction and extends laterally on the first insulating layer and extends through the first via opening in the second vertical direction to form the first conductive via in direct contact with the contact pad of the semiconductor device; and forming a second conductive trace that extends from the second insulating layer in the second vertical direction and extends laterally on the second insulating layer.

32. The method of claim 31, wherein the forming the first build-up circuitry includes:

forming an additional first via opening that extends through the first insulating layer and is aligned with the stiffener; and then forming the first conductive trace that extends through the additional first via opening in the second vertical direction to form an additional first conductive via in direct contact with the stiffener.

33. The method of claim 31, wherein the forming the second build-up circuitry includes:

forming second via openings that extend through the second insulating layer and are aligned with the inactive surface of the semiconductor device and the stiffener; and then forming the second conductive trace that extends through the second via openings in the first vertical direction to form second conductive vias in direct contact with the inactive surface of the semiconductor device and the stiffener.

34. The method of claim 26, wherein the providing the plated through-hole includes:

forming a through-hole that extends through the stiffener and the dielectric layer in the vertical directions; and then depositing a connecting layer on an inner sidewall of the through-hole.

35. The method of claim 26, wherein the stopper include a continuous or discontinuous strip or an array of posts.

36. The method of claim 26, wherein a gap in between the semiconductor device and the stopper is in a range of 0.001 to 1 mm.

37. The method of claim 26, wherein the stopper has a height in a range of 10 to 200 microns.

38. The method of claim 26, wherein the stiffener is a laminated epoxy or polyimide.

* * * * *